(12) United States Patent
Draper et al.

(10) Patent No.: US 7,684,452 B1
(45) Date of Patent: Mar. 23, 2010

(54) ENHANCING THE TRANSITION RATE OF A LASER

(75) Inventors: Daniel Draper, Portland, OR (US); Jerome Garez, Beaverton, OR (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 803 days.

(21) Appl. No.: 11/264,322

(22) Filed: Nov. 1, 2005

(51) Int. Cl.
  *H01S 3/00* (2006.01)
(52) U.S. Cl. ............... 372/38.02; 372/38.07; 372/38.1
(58) Field of Classification Search ............ 372/38.1, 372/38.01–38.09
See application file for complete search history.

(56) References Cited

U.S. PATENT DOCUMENTS 4,558,465 A * 12/1985 Siegel et al. ............. 398/195
5,285,464 A * 2/1994 Ogino ..................... 372/38.07
2002/0163945 A1* 11/2002 Kwark ...................... 372/31

OTHER PUBLICATIONS

Application Note: "Single Ended vs. Differential Methods of Driving a Laser Diode"- HFAN-02.5.0 Maxim Integrated Products, May 2004.*
Author Unknown, "Single-Ended vs. Differential Methods of Driving a Laser Diode," Application Note, Maxim, Integrated Products, pp. 1-5, May 25, 2004.

* cited by examiner

Primary Examiner—Minsun Harvey
Assistant Examiner—Xnning Niu
(74) Attorney, Agent, or Firm—Thomas, Kayden, Horstemeyer & Risley, LLP

(57) ABSTRACT

Various circuits and methods are provided for driving a laser. A laser driver circuit is configured to generate a modulated current through a laser. Also, a peak current source is employed to generate a peak current that is differentially applied to the laser to enhance a transition rate of the laser.

14 Claims, 5 Drawing Sheets

ENHANCING THE TRANSITION RATE OF A LASER

BACKGROUND

Lasers employed in communications systems and networks include lasers operated in a common anode configuration or a common cathode configuration. Such lasers may employ monitor photodiodes to obtain feedback as to the strength of the laser at any given time. A laser in a common anode configuration is generally constructed with the anode of the laser and the cathode of the monitor photodiode coupled together and to the case of the circuit package used for heat sinking. A laser in a common cathode configuration is generally constructed with the cathode of the laser and the anode of the monitor photodiode coupled together and to the case of packaging as well. Lasers in both common anode and common cathode configurations are employed in various applications. Lasers in common anode configurations may generate laser radiation of greater magnitude and may be employed, for example, where greater laser power is needed such as in data communications applications involving transmission over optical fiber. Lasers in common cathode configurations may be employed in applications with laser power of lesser magnitudes such as is the case, for example, with Vertical Cavity Surface Emitting Lasers (VCSELs). Lasers operated in either configuration may be driven by an appropriate laser driver circuit for data communications applications. Unfortunately, such drivers may experience difficulty in driving a given laser so as to maintain optimum transition rates between optical zeros and ones for data communication.

BRIEF DESCRIPTION OF THE SEVERAL VIEWS OF THE DRAWINGS

The invention can be understood with reference to the following drawings. The components in the drawings are not necessarily to scale. Also, in the drawings, like reference numerals designate corresponding parts throughout the several views.

DETAILED DESCRIPTION

Figure 1:
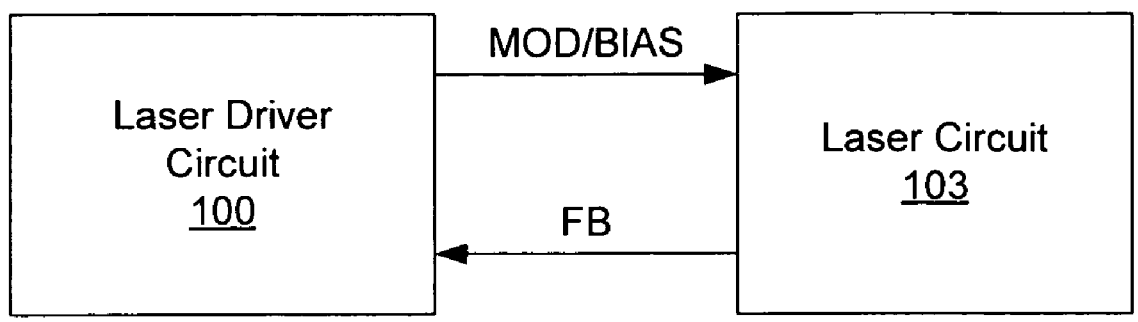
FIG. 1 is a block diagram of a laser and laser driver circuit according to an embodiment of the present invention.

Turning then to FIG. 1, shown is a block diagram of a laser driver circuit 100 that is in data communication with a laser 103. The laser 103 may be operated in a common anode configuration or a common cathode configuration. The laser driver circuit 100 generates modulation and bias currents (MOD/BIAS) that are applied to and power the laser 103. A portion of the radiation generated by the laser 103 is directed to a photodiode. In response thereto, the photodiode generates a feedback current signal (FB). This feedback current signal (FB) is applied to a bias control circuit that, in turn, generates a signal that is applied to the laser driver circuit 100. In response to this signal, the laser driver circuit 100 adjusts or otherwise maintains the bias current to keep the feedback current signal (FB) at a constant average current for the optimal performance of the laser 103.

Figure 2:
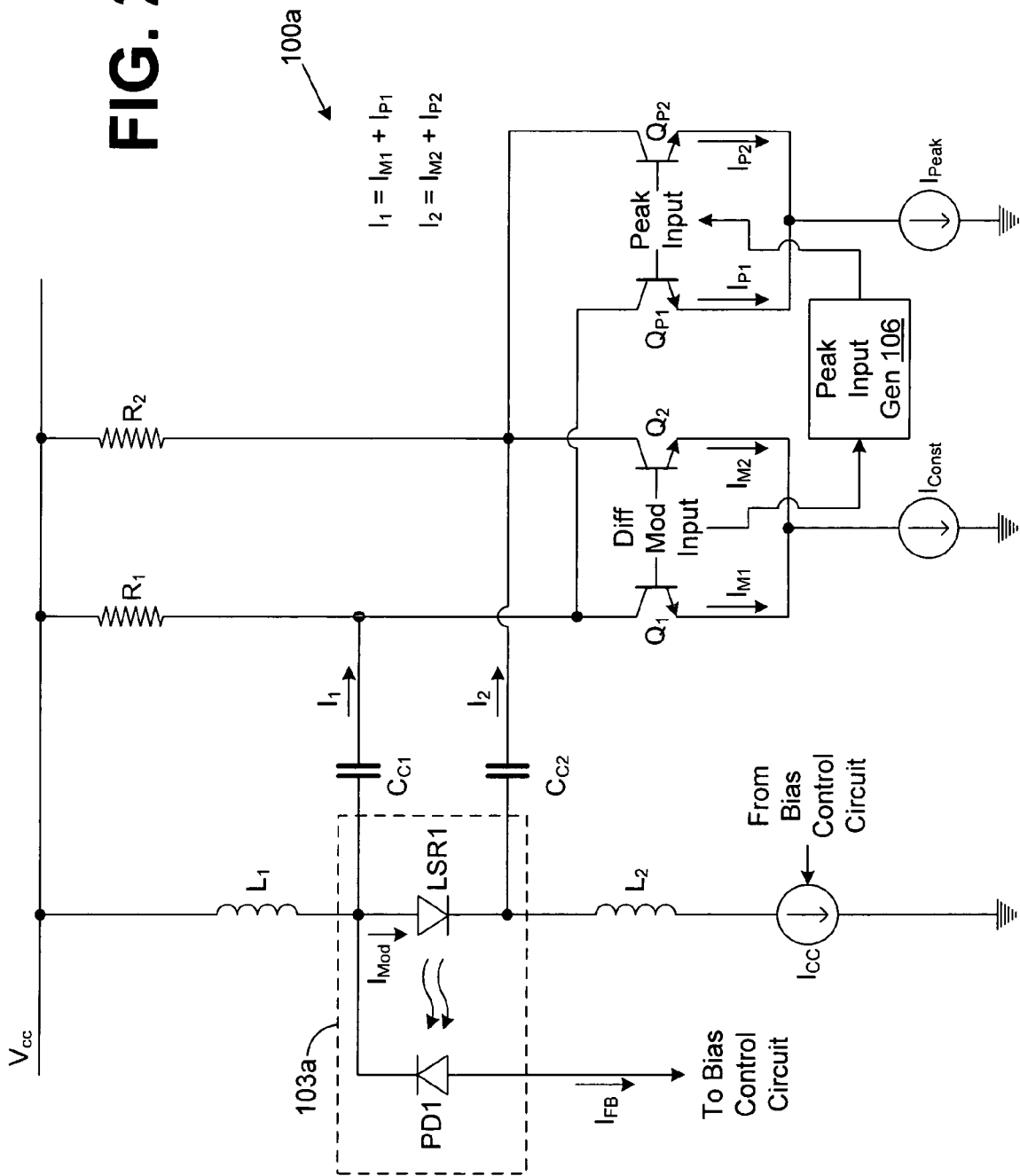
FIG. 2 is a schematic of one example of the laser driver circuit of FIG. 1 according to an embodiment of the present invention.

With reference to FIG. 2, shown is a schematic that illustrates one example of the laser driver circuit 100 denoted herein as laser driver circuit 100a according to an embodiment of the present invention. The laser driver circuit 100a may be employed to drive a laser LSR1 of a laser circuit 103a embodied in a common anode configuration. It is understood that the laser driver circuit 100 is merely an example of many other types of circuits that may be employed to drive the laser LSR1 in a common anode configuration according to the various embodiments of the present invention. The laser driver circuit 100a includes a conductor to which a voltage $V_{CC}$ is applied to power the laser driver circuit 100a. In this respect, the voltage $V_{CC}$ may be generated by a power supply external to the laser driver circuit 100a as can be appreciated.

In one embodiment, the voltage source $V_{CC}$ is coupled to both the anode of the laser LSR1 and to the cathode of the photodiode PD1 of the laser circuit 103a through the inductance $L_1$, where the laser LSR1 and the photodiode PD1 are embodied in the common anode configuration. The cathode of the laser LSR1 is coupled to current source $I_{CC}$ through inductance $L_2$. The current source $I_{CC}$ is coupled to ground. The anode of the photodiode PD1 is coupled to a bias control circuit as shown.

The laser driver circuit 100a includes modulation transistors $Q_1$ and $Q_2$. A differential modulation input is applied to the bases of the modulation transistors $Q_1$ and $Q_2$ to drive the laser LSR1. The anode of the laser LSR1 is coupled to the modulation transistor $Q_1$ through coupling capacitor $C_{C1}$, and the cathode of the laser LSR1 is coupled to the modulation transistor $Q_2$ through coupling capacitor $C_{C2}$ as shown.

Also, the modulation transistors $Q_1$ and $Q_2$ are coupled to the constant current source $I_{Const}$, where $I_{Const}$ can be provided directly or by other means of control or feedback. The differential modulation input employed to drive the modulation transistors $Q_1$ and $Q_2$ may embody data to be transmitted as can be appreciated. The differential modulation input applies opposing signals to the respective bases of the modulation transistors $Q_1$ and $Q_2$. Current $I_{M1}$ flows through the modulation transistor $Q_1$ and current $I_{M2}$ flows through the modulation transistor $Q_2$.

Also, the laser driver circuit 100a includes peaking transistors $Q_{P1}$ and $Q_{P2}$. Each of the peaking transistors $Q_{P1}$ and $Q_{P2}$ is coupled to a peaking current source $I_{Peak}$. A differential peak input is applied to the bases of the peaking transistors $Q_{P1}$ and $Q_{P2}$. The differential peak input is generated from the differential modulation input by a peak input generator 106. Peaking current $I_{P1}$ flows through the peaking transistor $Q_{P1}$ and peaking current $I_{P2}$ flows through the peaking transistor $Q_{P2}$. The peaking transistors $Q_{P1}$ and $Q_{P2}$ are also coupled to the first and second coupling capacitors $C_{C1}$ and $C_{C2}$ as shown.

The photodiode PD1 generates feedback current $I_{FB}$ that is applied to a bias control circuit. The bias control circuit is coupled to a control input of the current source $I_{CC}$. In this respect, the feedback from the photodiode PD1 is employed to control the magnitude of the current generated by the current source $I_{CC}$.

The modulation transistors $Q_1$ and $Q_2$ are driven by the differential modulation input signal to establish a modulated current through the laser LSR1. The differential modulation input signal causes the laser LSR1 to generate laser light output that represents the data embodied in the modulation signal for transmission, for example, across optical fiber or other optical signal pathway. The laser driver circuit 100a also includes resistors $R_1$ and $R_2$ that are coupled between the source voltage $V_{CC}$ and the modulation transistors $Q_1$ and $Q_2$. In one embodiment, the resistance of each of the resistors $R_1$ and $R_2$ is approximately equal to the resistance inherent in the laser LSR1.

The inductances $L_1$ and $L_2$ inhibit the flow of AC current and allow DC current to flow therethrough. Conversely, the coupling capacitances $C_{C1}$ and $C_{C2}$ prevent the flow of DC current therethrough, and allow the passage of AC current. Given that the data signals that are embodied in the differential modulation input are generally high frequency signals, the coupling capacitors $C_{C1}$ and $C_{C2}$ allow the laser LSR1 to be modulated by these signals, while the inductances $L_1$ and $L_2$ provide for DC flow of a proper bias current as will be described.

The current source $I_{CC}$ is employed to maintain a bias current in the laser LSR1. A portion of the bias current supplied by the current source $I_{CC}$ is a laser threshold current that is a minimum amount of current necessary to ensure that the laser LSR1 stays in an operational state. In addition, the bias current generated by the current source $I_{CC}$ generates a further amount of current that ultimately drives the laser LSR1 in a state that is the midpoint between an optical "0" and an optical "1". The laser driver circuit 100a also includes the current source $I_{Const}$ that generates a constant current. A portion of the current generated by the constant current source $I_{Const}$ is either added to or subtracted from the bias current applied to the laser in response to the differential modulation input. The addition or subtraction of the portion of the current generated by the current source $I_{Const}$ from the bias current results in a modulated current that flows through the laser LSR1. If the total current applied to the laser LSR1 at any one time falls below the laser threshold current, then greater current would have to be applied to the laser LSR1 to place it back into the operational state. This would introduce an unwanted delay in the operation of the laser LSR1. Where data information is transmitted at frequencies in the megahertz range or greater, such a delay would be very costly and potentially result in a significant loss of data. As a result, the current source $I_{CC}$ maintains a proper minimum bias current in the laser LSR1.

During operation of the laser driver circuit 100a, the current source $I_{CC}$ establishes an amount of current through the laser LSR1 so that the laser LSR1 generates an output that is midway between an optical "0" and an optical "1". In this respect, the current generated by the current source $I_{CC}$ ensures that a constant average current is maintained through the laser LSR1. If the current generated by the current source $I_{CC}$ falls below the laser threshold current, then the laser LSR1 will not be able to respond to modulated current until the laser threshold current is established as was described above.

By applying a differential modulating input signal to the modulation transistors $Q_1$ and $Q_2$, a modulated current $I_{Mod}$ is established through the laser LSR1. In particular, the differential modulating input causes the modulating transistors $Q_1$ and $Q_2$ to alternatively close and open. When $Q_1$ is open, $Q_2$ is closed and vice versa.

When $Q_2$ is closed and $Q_1$ is open, in one embodiment, current $I_{M2}$ flows through the transistor $Q_2$. The current $I_{M2}$ is equal to the current generated by the constant current source $I_{Const}$. Half of the current generated by the constant current source $I_{Const}$ flows through the resistor $R_2$. The remaining half flows through the coupling capacitor $C_{C2}$, the laser LSR1, and the coupling capacitor $C_{C1}$ as current $-(I_1)$. In this respect, a portion of the current generated by the constant current source $I_{Const}$ flows through the laser LSR1 and is added to the bias current generated by the current source $I_{CC}$. This results in an increase of the optical output power of laser LSR1 to create an optical "1".

When $Q_1$ is closed and $Q_2$ is open, current $I_{M1}$ flows through the transistor $Q_1$. The current $I_{M1}$ is equal to the current generated by the constant current source $I_{Const}$. Half of the current generated by the current source $I_{Const}$ flows through the resistor $R_1$, and the remaining half is "robbed" from the current flowing through the inductance $L_1$ and flows through the coupling capacitor $C_{C1}$ as current $I_1$. In this respect, the current generated by the current source $I_{Const}$ is subtracted from the bias current generated by the current source $I_{CC}$. To make up for the shortfall in current in this respect, the current source $I_{CC}$ pulls current $-(I_2)$ through resistor $R_2$ and the coupling capacitor $C_{C2}$. Thus, regardless of the states of the transistors $Q_1$ and $Q_2$, the current through the inductances $L_1$ and $L_2$ remains substantially unchanged.

Given that the differential modulation input typically causes rapid switching of the transistors $Q_1$ and $Q_2$, then the current that is added to or subtracted from the bias current flowing through the laser LSR1 are AC currents for which the coupling capacitors $C_{C1}$ and $C_{C2}$ present negligible impedance. The small closed current loop allows for better performance of the laser and for less electromagnetic emission, distortion, and noise. Since the switching only involves changes in current that are half way between that necessary to produce a logical "0" and a logical "1", the laser is actively turned on and off as opposed to being actively turned on and passively turned off. By doing so, a faster response is achieved on the laser LSR1.

The transition of a laser from an "on" state (optical "1") to an "off" state (optical "0") is slower than the opposite transition from the "off" state (optical "0") to an "on" state (optical "1"). According to the various embodiments of the invention, the peaking transistors $Q_{P1}$ and $Q_{P2}$ are advantageously employed to add current from the peaking current source $I_{Peak}$ to the current generated by the constant current source $I_{Const}$ to achieve faster transition of the laser LSR1.

For example, the peaking transistor $Q_{P2}$ is switched on and off to cause the peaking current $I_{P2}$ to be added to the current $I_{M2}$. The differential peak input is generated by the peak input generator 106. Consequently, the differential peak input generates the peaking current $I_{P2}$ so as to add an appropriate current peak to the current $I_{M2}$ to speed up a given transition to an acceptable level. The current $I_2$ equals the addition of the peaking current $I_{P2}$ and the current $I_{M2}$. Thus, by applying the differential peak input to the bases of the peaking transistors $Q_{P1}$ and $Q_{P2}$, the peak current $I_{P2}$ of the peaking current source $I_{Peak}$ is selectively added to the current $I_{M2}$, thereby enhancing the transition rate of the modulated current $I_{M2}$. The transition rate of the laser LSR1 is enhanced during a transition of the modulation current $I_{M2}$ from an "on" state to an "off" state. In this respect, the transition rate is increased from high to low. The transition rate of current $I_1$ is enhanced in a similar manner. Accordingly, when the transition rates of the currents $I_1$ and $I_2$ are increased or otherwise enhanced, then the transition rate of the modulated current $I_{Mod}$ is similarly enhanced and the output of the laser LSR1 turns off more rapidly. By differentially enhancing the modulation current, the current flow in and out of the laser LSR1 is symmetric which allows for faster speed and better overall performance of the laser LSR1 as well as generating less electromagnetic emission, distortion, and noise.

Figure 3:
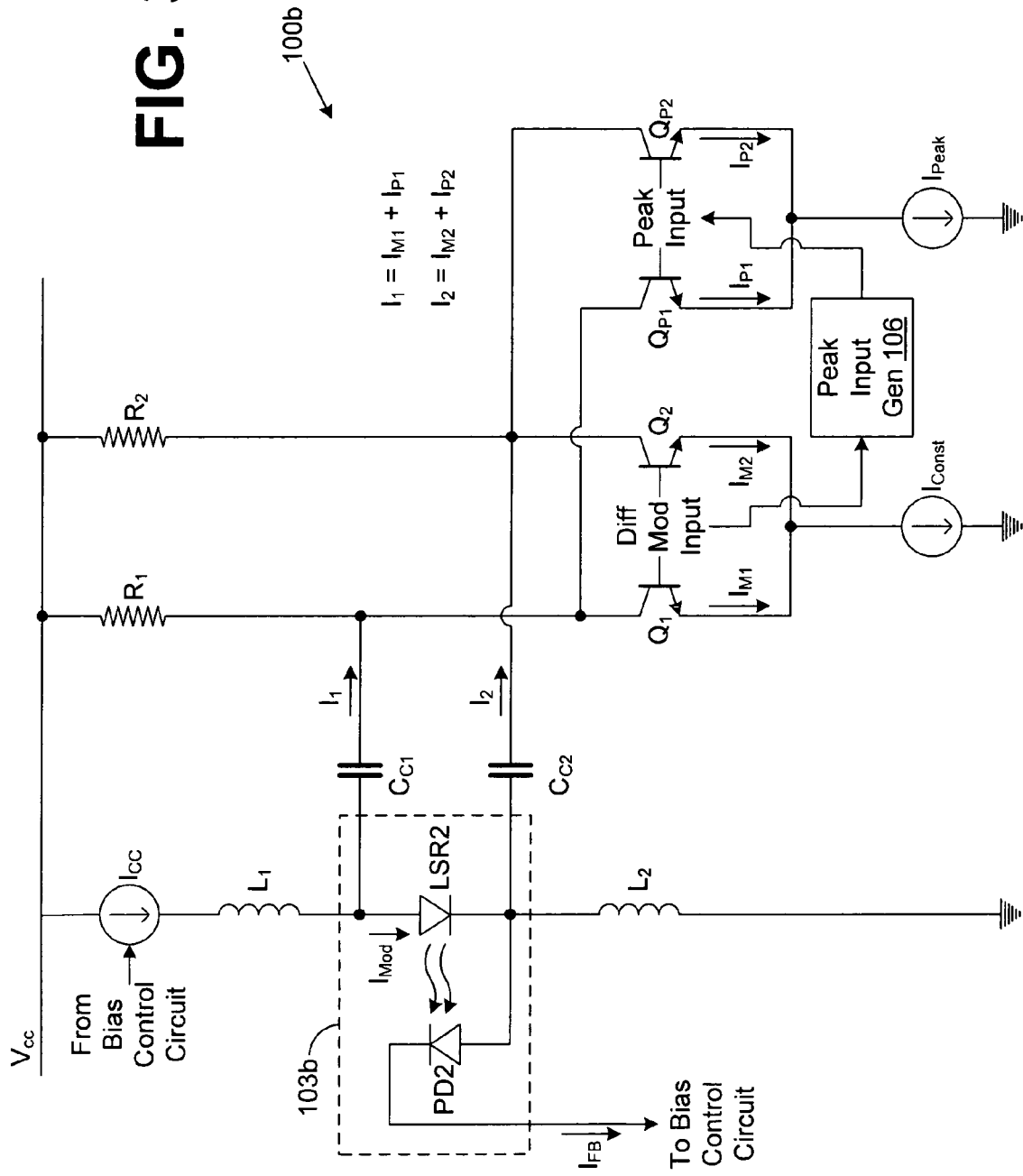
FIG. 3 is a schematic of a second example of the laser driver circuit of FIG. 1 according to an embodiment of the present invention.

With reference to FIG. 3, shown is a schematic that illustrates another example of the laser driver circuit 100 denoted herein as laser driver circuit 100b according to an embodiment of the present invention. The laser driver circuit 100b may be employed to drive a laser LSR2 of a laser circuit 103b embodied in a common cathode configuration. It is understood that the laser driver circuit 100b is merely another example of many other types of circuits that may be employed to drive the laser LSR2 in a common cathode configuration according to the various embodiments of the present invention.

The laser driver circuit 100b is similar to the laser driver circuit 100a (FIG. 2) with a couple of changes. Specifically, the current source $I_{CC}$ is coupled between the source voltage $V_{CC}$ and the inductance $L_1$. Also, the inductance $L_2$ is coupled between the laser LSR2 and ground as shown.

Once again, the inductances $L_1$ and $L_2$ inhibit the flow of AC current and allow a relatively constant DC current to flow therethrough. Conversely, the coupling capacitances $C_{C1}$ and $C_{C2}$ prevent the flow of DC current therethrough, and allow the passage of AC current. Given that the data signals that are embodied in the differential modulation input are generally high frequency signals, the coupling capacitors $C_{C1}$ and $C_{C2}$ allow the laser LSR2 to be modulated by these signals, while the inductances $L_1$ and $L_2$ provide for DC flow of a proper bias current as will be described.

The current source $I_{CC}$ is employed to maintain a bias current in the laser LSR2 as was with the case of the laser driver circuit 100a discussed above. The laser driver circuit 100a also includes the constant current source $I_{Const}$ that generates a constant current. A portion of the current generated by the constant current source $I_{Const}$ is either added to or subtracted from the bias current applied to the laser in response to the differential modulation input. The addition or subtraction of the portion of the current generated by the current source $I_{Const}$ from the bias current results in a modulated current $I_{Mod}$ that flows through the laser LSR2. If the total current applied to the laser LSR2 at any one time falls below the laser threshold current, then greater current would have to be applied to the laser LSR2 to place it back into the operational state. As was the case with the laser LSR1, this would introduce an unwanted delay in the operation of the laser LSR2. Where data information is transmitted at frequencies in the megahertz range or greater, such a delay would be very costly and potentially result in a significant loss of data. As a result, the current source $I_{CC}$ maintains a proper minimum bias current in the laser LSR2.

During operation of the laser driver circuit 100a, the current source $I_{CC}$ establishes an amount of current through the laser LSR2 so that the laser LSR2 generates an output that is midway between an optical "0" and an optical "1". In this respect, the current generated by the current source $I_{CC}$ ensures that a constant average current is maintained through the laser LSR2. If the current generated by the current source $I_{CC}$ falls below the laser threshold current, then the laser LSR2 will not be able to respond to modulated current until the laser threshold current is established as was described above.

By applying a differential modulating input signal to the modulation transistors $Q_1$ and $Q_2$, a modulated current $I_{Mod}$ is established through the laser LSR2. In particular, the differential modulating input causes the modulating transistors $Q_1$ and $Q_2$ to alternatively close and open. When $Q_1$ is open, $Q_2$ is closed and vice versa.

When $Q_2$ is closed and $Q_1$ is open, in one embodiment, current $I_{M2}$ flows through the transistor $Q_2$. The current $I_{M2}$ is equal to the current generated by the constant current source $I_{Const}$. Half of the current generated by the constant current source $I_{Const}$ flows through the resistor $R_2$. The remaining half flows through the resistor $R_1$, the coupling capacitor $C_{C1}$ (as current $-I_1$), the laser LSR2, and the coupling capacitor $C_{C2}$ (as current $I_2$). In this respect, a portion of the current generated by the constant current source $I_{Const}$ flows through the laser LSR2 and is added to the bias current generated by the current source $I_{CC}$. This results in an increase of the optical output power of laser LSR2 to create an optical "1".

When $Q_1$ is closed and $Q_2$ is open, current $I_{M1}$ flows through the transistor $Q_1$. The current $I_{M1}$ is equal to the current generated by the constant current source $I_{Const}$. Half of the current generated by the current source $I_{Const}$ flows through the resistor $R_1$, and the remaining half is "robbed" from the current flowing from the current source $I_{CC}$ through the inductance $L_1$. This current flows through the coupling capacitor $C_{C1}$ as current $I_1$. In this respect, the current generated by the current source $I_{Const}$ is subtracted from the bias current generated by the current source $I_{CC}$. To make up for the shortfall in current flowing into the inductance $L_2$ in this respect, current is pulled through resistor $R_2$ and the coupling capacitor $C_{C2}$ as current $-(I_2)$. Thus, regardless of the states of the transistors $Q_1$ and $Q_2$, the current through the inductances $L_1$ and $L_2$ remains the substantially unchanged.

Given that the differential modulation input typically causes rapid switching of the transistors $Q_1$ and $Q_2$, then the current that is added to or subtracted from the bias current flowing through the laser LSR2 are AC currents for which the coupling capacitors $C_{C1}$ and $C_{C2}$ present negligible impedance. The small closed current loop also allows for better performance of the laser and for less electromagnetic emission, distortion, and noise. Since the switching only involves changes in current that are half way between that necessary to produce a logical "0" and a logical "1", in this embodiment the laser is actively turned on and off as opposed to being actively turned on and passively turned off. Consequently, a faster response is achieved on the laser LSR2.

The transition of the laser LSR2 from an "on" state (optical "1") to an "off" state (optical "0") may be slower than the opposite transition from the "off" state (optical "0") to an "on" state (optical "1"). According to the various embodiments of the invention, the peaking transistors $Q_{P1}$ and $Q_{P2}$ are advantageously employed to add current from the peaking current source $I_{Peak}$ to the current generated by the constant current source $I_{Const}$ to achieve faster transition of the laser LSR2.

For example, as was the case with the laser driver circuit 100a discussed above, the peaking transistor $Q_{P2}$ is switched on and off to cause the peaking current $I_{P2}$ to be added to the current $I_{M2}$. The differential peak input is generated by the peak input generator 106. Consequently, the differential peak input generates the peaking current $I_{P2}$ so as to add an appropriate current peak to the current $I_{M2}$ to speed up a given transition to an acceptable level. The current $I_2$ equals the addition of the peaking current $I_{P2}$ and the current $I_{M2}$. Thus, by applying the differential peak input to the bases of the peaking transistors $Q_{P1}$ and $Q_{P2}$, the peak current $I_{P2}$ of the peaking current source $I_{Peak}$ is selectively added to the current $I_{M2}$, thereby enhancing the transition rate of the modulated current $I_{M2}$ and the current flowing through the laser LSR2. The transition rate if the laser LSR2 is enhanced during a transition of the modulation current $I_{M2}$ from an "on" state to an "off" state. In this respect, the transition rate is increased from high to low. The transition rate of current $I_1$ is enhanced in a similar manner. Accordingly, when the transition rates of the currents $I_1$ or $I_2$ are increased or otherwise enhanced, then the transition rate of the modulated current $I_{Mod}$ is similarly enhanced and the output power of the laser LSR2 turns off more rapidly. By differentially enhancing the modulation current, the current flow in and out of the laser LSR2 is symmetric which allows for faster speed and better overall performance of the laser LSR2 as well as generating less electromagnetic emissions, distortion, and noise.

Figure 4:
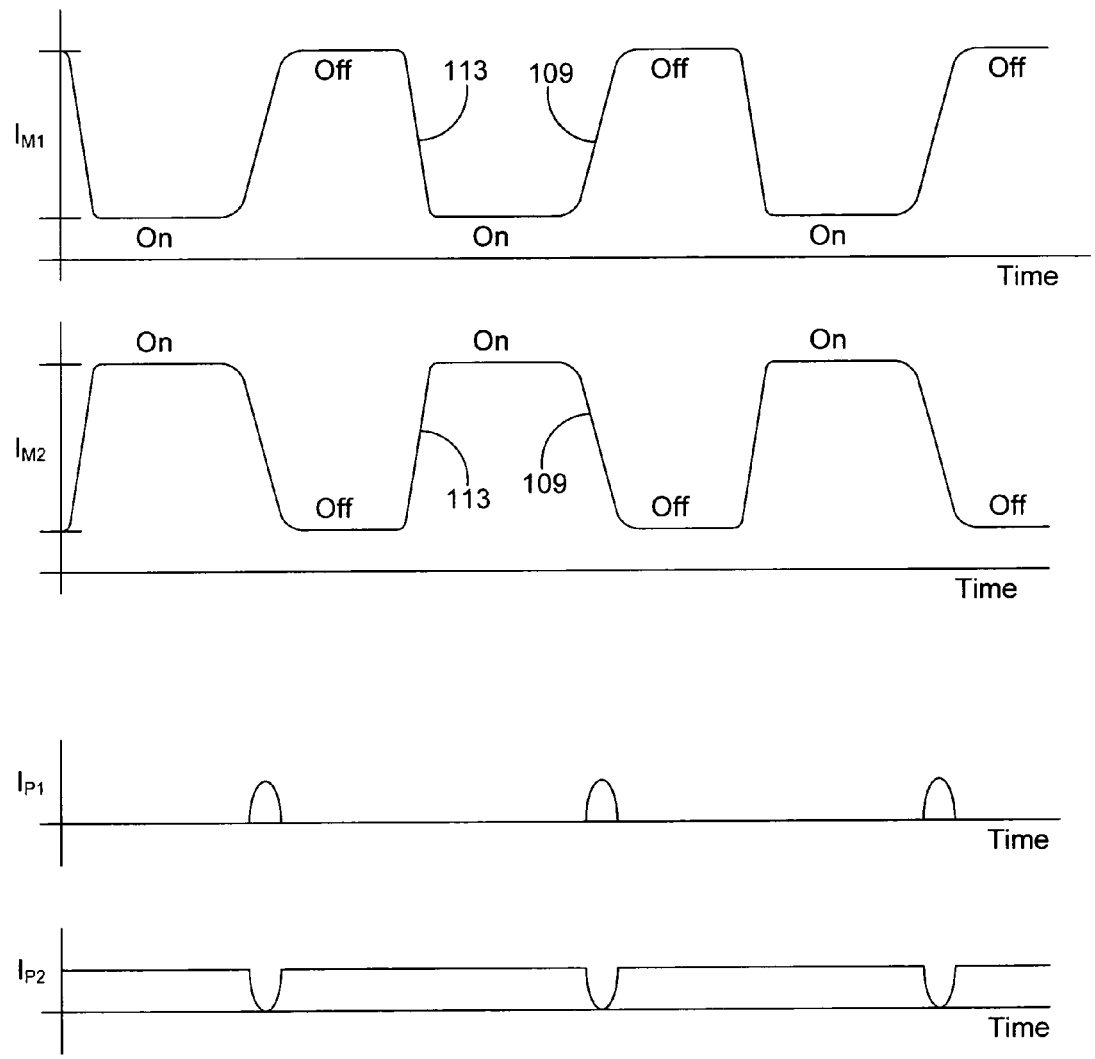
FIG. 4 is a drawing depicting modulation current and a peaking current generated by the laser driver circuits of FIGS. 2 and 3 according to an embodiment of the present invention.

Referring next to FIG. 4, shown are graphs that depict one example of the currents $I_{M1}$, $I_{M2}$, $I_{P1}$, and $I_{P2}$ according to one embodiment of the present invention. The peak currents $I_{P1}$ and $I_{P2}$ comprise a plurality of peaks. The peak current $I_{P1}$ comprises a plurality of positive peaks and the peak current $I_{P2}$ comprises a plurality of inverted peaks.

Figure 5:
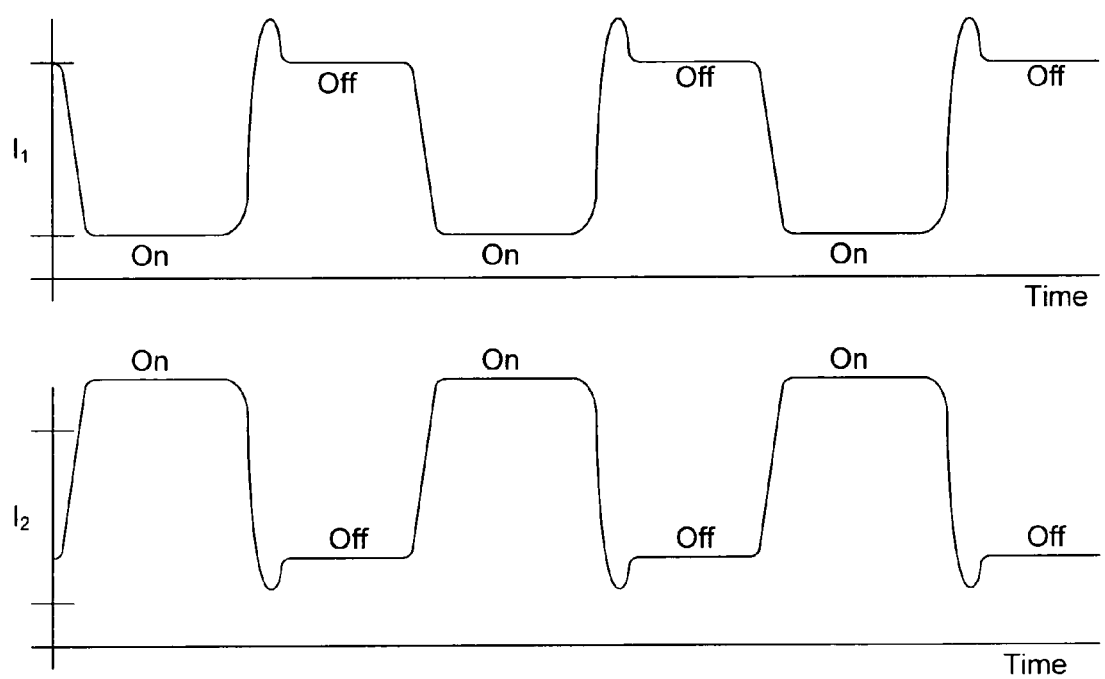
FIG. 5 is a drawing that depicts the application of the peaking currents generated by the laser driver circuits of FIGS. 2 and 3 to the corresponding modulation currents generated by the laser driver circuits of FIGS. 2 and 3 according to an embodiment of the present invention.

With reference to FIG. 5, shown are graphs that depict one example of the resulting currents $I_1$ and $I_2$ from the combination of the currents $I_{M1}$ and $I_{M2}$ with the peak currents $I_{P1}$ and $I_{P2}$, respectively. The current $I_1$ is equal to the addition of the current $I_{M1}$ and the peaking current $I_{P1}$, and the current $I_2$ is equal to the addition of the current $I_{M2}$ and the peaking current $I_{P2}$.

Although the invention is shown and described with respect to certain embodiments, it is obvious that equivalents and modifications will occur to others skilled in the art upon the reading and understanding of the specification. The present invention includes all such equivalents and modifications, and is limited only by the scope of the claims.

What is claimed is:

1. A laser driver, comprising:
  a laser driver circuit configured to generate a modulated current through laser, a current source being employed in the laser driver circuit to generate a current, wherein at least a portion of the current is added to or subtracted from a bias current applied to the laser in response to a differential nodulation input, thereby generating the modulated current through the laser; and
  a peak current source employed to generate a peak current that is applied to the laser to enhance a transition rate of the laser,
  wherein the laser driver circuit further comprises a first pair of transistors that cause the current to be added to or subtracted from the bias current applied to the laser in response to the differential modulation input, and
  wherein the laser driver circuit further comprises a second pair of transistors that cause the peak current to be applied to the laser in response to a differential peak input.

2. The laser driver of claim 1, wherein the differential peak input is generated based upon the differential modulation input.

3. A method for driving a laser, comprising the steps of:
  generating a modulated current through the laser with a laser driver circuit
  generating a peak current comprising a plurality of peaks;
  applying the peak current to the laser to enhance a transition rate of the laser;
  generating a current with a current source in the laser driver circuit; and
  adding or subtracting at least a portion of the current to or from a bias current applied to the laser in response to a differential modulation input, thereby generating the modulated current through the laser,
  wherein the step of adding or subtracting the at least a portion of the current to or from the bias current applied to the laser in response to the differential modulation input further comprising manipulating a first pair of transistors that cause the current to be added to or subtracted from the bias current in response to the differential modulation input, and
  wherein the step of applying the peak current to the laser to enhance a transition rate of the laser further comprises the step of manipulating a second pair of transistors that cause the peak current to be applied to the laser in response to a differential peak input.

4. The method of claim 3, further comprising the step of generating the differential peak input based upon the differential modulation input.

5. A laser driver, comprising:
  a laser driver circuit configured to generate a modulated current through a laser, wherein the generated modulation current causes the laser to have a transition rate;
  a peak current source employed to generate a peak current that is applied to the laser to enhance the transition rate of the laser;
  wherein the laser driver circuit further comprises a current source employed to generate a current;
  wherein at least a portion of the current is added to or subtracted from a bias current applied to the laser in response to a modulation input, thereby generating the modulated current through the laser; and
  wherein the laser driver circuit further comprises:
  a first pair of transistors that cause the current to be added to or subtracted from the bias current applied to the laser in response to the modulation input; and
  a second pair of transistors that cause the peak current to be applied to the laser in response to a differential peak input.

6. A laser driver, comprising:
  a laser driver circuit configured to generate a modulated current through a laser, wherein the generated modulation current causes the laser to have a transition rate; the laser driver circuit comprising a current source to generate a current;
  a peak current source employed to generate a peak current that is applied to the laser to enhance the transition rate of the laser; wherein the peak current increases the transition rate of the laser from an on state to an off state; and
  wherein the laser driver circuit further comprises:
  a first pair of transistors that cause at least a portion of current to be added to or subtracted from a bias current applied to the laser in response to a modulation input; and
  a second pair of transistors that cause the peak current to be applied to the laser in response to a differential peak input.

7. The laser driver of claim 5, wherein the peak current further comprises a plurality of inverted peaks.

8. The laser driver of claim 5, wherein the peak current further comprises a plurality of positive peaks.

9. The laser driver of claim 5, wherein the modulation input is a differential modulation input.

10. The laser driver of claim 9, wherein the differential peak input is generated based upon the differential modulation input.

11. The laser driver of claim 6, wherein the peak current further comprises a plurality of inverted peaks.

12. The laser driver of claim 6, wherein the peak current further comprises a plurality of positive peaks.

13. The laser driver of claim 6, wherein the modulation input is a differential modulation input.

14. The laser driver of claim 13, the differential peak input is generated based upon the differential modulation input.

* * * * *